(12) United States Patent
Hossain

(10) Patent No.: US 7,948,033 B2
(45) Date of Patent: May 24, 2011

(54) SEMICONDUCTOR DEVICE HAVING TRENCH EDGE TERMINATION STRUCTURE

(75) Inventor: Zia Hossain, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1137 days.

(21) Appl. No.: 11/671,514

(22) Filed: Feb. 6, 2007

(65) Prior Publication Data

US 2008/0185643 A1 Aug. 7, 2008

(51) Int. Cl.
*H01L 29/66* (2006.01)
(52) U.S. Cl. .............................. 257/342; 257/E29.051
(58) Field of Classification Search .......... 257/213–255, 257/288, 327, 335, 341, 342, E29.001, E29.002, 257/E29.005, E29.043, E29.049, E29.05, 257/E29.051, E29.056
See application file for complete search history.

(56) References Cited

U.S. PATENT DOCUMENTS

| | | | |
|---|---|---|---|
| 3,877,053 A * | 4/1975 | Kaplit | 257/312 |
| 6,204,097 B1 | 3/2001 | Shen et al. | |
| 6,236,099 B1 * | 5/2001 | Boden, Jr. | 257/495 |
| 6,307,246 B1 | 10/2001 | Nitta et al. | |
| 6,410,958 B1 | 6/2002 | Usui et al. | |
| 6,982,193 B2 | 1/2006 | Hossain et al. | |
| 7,015,104 B1 | 3/2006 | Blanchard | |
| 2005/0181558 A1 | 8/2005 | Hshieh | |
| 2006/0118864 A1 * | 6/2006 | Hirler et al. | 257/335 |
| 2006/0160309 A1 | 7/2006 | Hshieh | |
| 2006/0231915 A1 | 10/2006 | Hshieh et al. | |
| 2006/0252219 A1 | 11/2006 | Hshieh | |
| 2007/0173021 A1 * | 7/2007 | Kocon et al. | 438/270 |

FOREIGN PATENT DOCUMENTS

WO  WO-2005096389 A1 * 10/2005

OTHER PUBLICATIONS

T. Nitta, T. Minato, M. Yano, A. Uenisi, M. Harada and S. Hine; "Experimental Results and Simulation Analysis of 250V Super Trench Power MOSFET (STM)"; ISPSD'2000 IEEE. Catalog No. 00CH37094C.

T. Minato, T. Nitta, A. Uenisi, M. Yano, M. Harada and S. Hine; "Which is Cooler, Trench or Mutli-Epitaxy?" ISPSD'2000 IEEE. Catalog Number: 00CH37094C.

Jack Glenn and Jim Siekkinen; "A Novel Vertical Deep Trench Resurf Dmos (VTR-DMOS)"; ISPSD'2000 IEEE. Catalog Number: 00CH37094C.

\* cited by examiner

*Primary Examiner* — Ha Tran T Nguyen
*Assistant Examiner* — Kevin Quinto
(74) *Attorney, Agent, or Firm* — Kevin B. Jackson

(57) ABSTRACT

In one embodiment, a device is formed in a region of semiconductor material. The device includes active cell trenches and termination trenches each having doped sidewall surfaces that compensate the region of semiconductor material during reverse bias conditions to form a superjunction structure. The termination trenches include a trench fill material that enhances depletion region spread during reverse bias conditions.

20 Claims, 3 Drawing Sheets

SEMICONDUCTOR DEVICE HAVING TRENCH EDGE TERMINATION STRUCTURE

FIELD OF THE INVENTION

This invention relates generally to semiconductor devices, and more specifically to superjunction devices and methods of their manufacture.

BACKGROUND OF THE INVENTION

Semiconductor chip manufacturers have introduced superjunction metal-oxide field effect transistors (MOSFETs) as devices capable of balancing the critical relationship between on-state resistance (Rdson) and breakdown voltage (BVdss). In an n-channel superjunction MOSFET, the conventional lightly doped n-type epitaxial region is replaced with a more heavily doped n-type epitaxial region. Heavily doped p-type columns are then formed within the heavily doped n-type epitaxial region to produce alternating columns or regions of p-type and n-type material along the thickness of the epitaxial layer. In the on state, conduction current flows through the n-type columns to reduce Rdson. During the off state, the p-type and n-type columns deplete or compensate each other to maintain a high BVdss. For p-channel devices, the above stated conductivity types are reversed.

Although superjunction devices provide lower Rdson and sustain higher BVdss compared to conventional devices, several challenges still exist with superjunction structures. For example, the more heavily doped epitaxial layers used in these structures make edge termination structures more complicated because conventional termination structures such as floating rings and field plates do not hold the required breakdown voltages like they do for more lightly doped epitaxial layers.

Accordingly, termination structures and methods of manufacture are needed that more closely match superjunction active cell structures. It is desired that such termination structures and methods maintain process simplicity and sustain required BVdss.

DETAILED DESCRIPTION OF THE DRAWINGS

Figure 1:
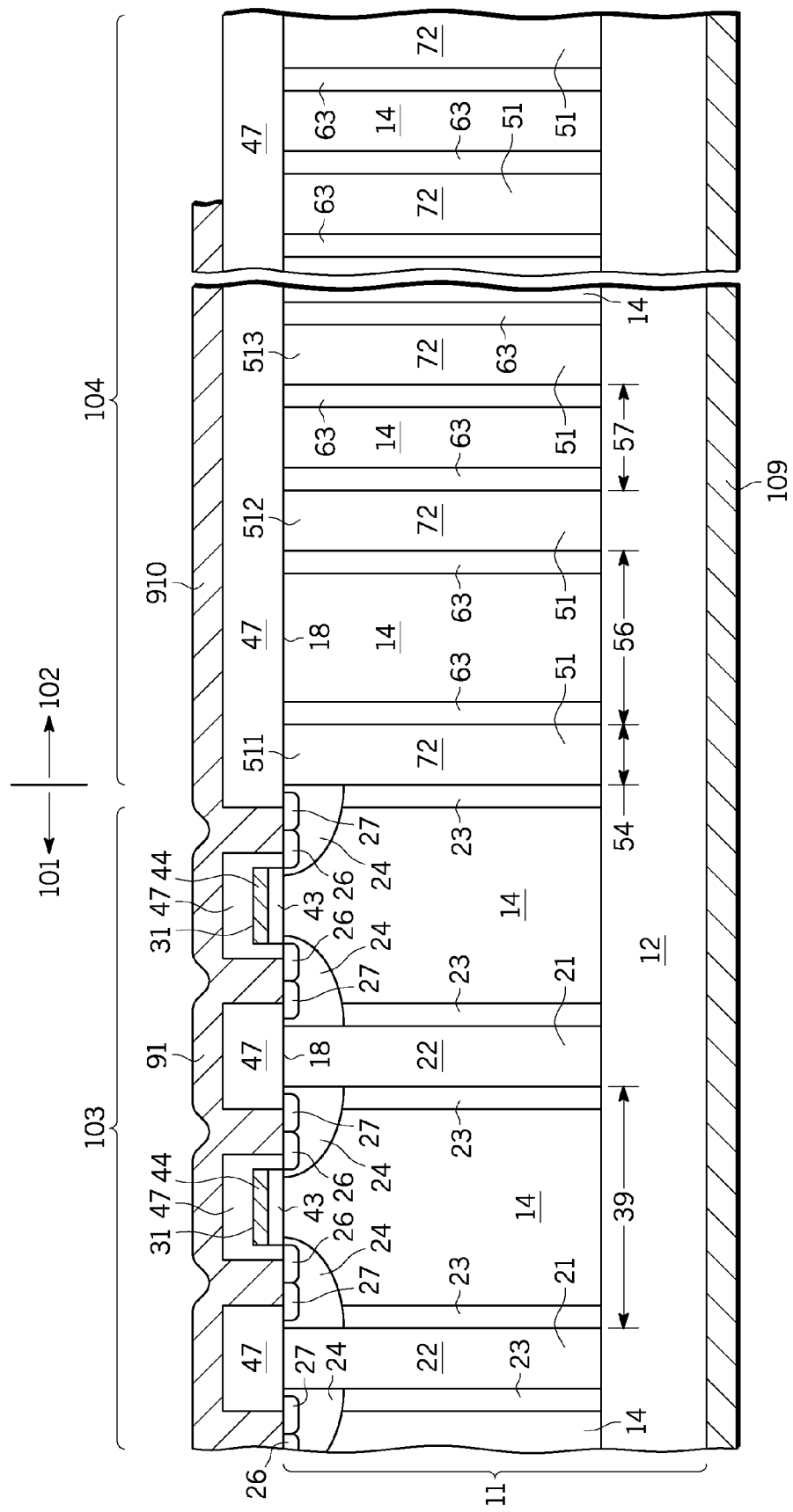
FIG. 1 illustrates an enlarged partial cross-sectional view of a first embodiment of a superjunction device.

In general, the following description relates to a structure for and method of manufacturing a semiconductor device that includes a termination structure and active structures to lower its on-resistance and increase its breakdown voltage. It should be understood that termination structures are also referred to as relaxation regions because they reduce electric field effects at the edges of semiconductor devices. More particularly, the following description relates to a semiconductor device having a field termination structure combined with a superjunction structure that helps reduce leakage and on-resistance, and that helps maintain or enhance breakdown voltage.

For ease of understanding, elements in the drawing figures are not necessarily drawn to scale, and like element numbers are used where appropriate throughout the various figures. For clarity in the drawings, doped regions of device structures or regions may be illustrated as having generally straight line edges and precise angular corners. However, those skilled in the art understand that due to the diffusion and activation of dopants the edges of doped regions generally are not straight lines and the corners are not precise angles, and typically are rounded. While the discussion below describes an n-channel device, the invention also pertains to p-channel devices, which may be formed by reversing the conductivity types of the described layers and/or regions.

In addition, the device of the present invention may embody either a multiple body or base design (where the body or base regions are a plurality of discrete regions), or a single body or base design (where the body or base region comprises a single region formed in an elongated pattern such as in a serpentine pattern). However, the device of the present invention will be described as a multiple body design throughout the description for ease of understanding. It should be understood that it is intended that the present invention encompass both a multiple body design and a single body design.

FIG. 1 shows an enlarged partial cross-sectional view of an insulated gate field effect transistor (IGFET), MOSFET, superjunction device, or switching device or cell 10 in accordance with a first embodiment. By way of example, device 10 is among many such devices integrated with logic and/or other components into a semiconductor chip as part of a power integrated circuit. Alternatively, device 10 is among many such devices integrated together to form a discrete transistor device. By way of further example, device 10 comprises a MOSFET, an IGBT, a MOS-gated thyristor, or the like.

Device 10 includes semiconductor material 11, which comprises for example, an n-type semiconductor substrate (e.g., silicon) 12 having a resistivity in range of approximately 0.001 to about 0.005 ohm-cm, and may be doped with arsenic. In the embodiment shown and by way of example, substrate 12 provides a drain contact. When device 10 is configured as an IGBT or MOS gated thyristor, semiconductor substrate 12 comprises a p-type conductivity. Device 10 further includes an active region 101 for forming active devices 103 and a termination region 102 for forming termination structure 104.

A region of semiconductor material or semiconductor layer 14 is formed in spaced relationship to (i.e., in, within, on or overlying) substrate 12, and is doped, for example, n-type. In one embodiment, layer 14 is formed using conventional epitaxial growth techniques. In an alternative embodiment, layer 14 is formed using conventional doping and diffusion techniques. In an embodiment suitable for a 650 volt device, layer 14 is n-type with a dopant concentration of about $1.0 \times 10^{15}$ atoms/cm$^3$ to about $1.0 \times 10^{16}$ atoms/cm$^3$, has a thickness on the order of about 40 micrometers, and has a distance 39 between active trenches 21 (described below) of about seven (7) micrometers. The thickness of layer 14 and distance 39 are increased or decreased depending on the desired BVdss rating of device 10 (e.g., higher BVdss means a thicker layer 14 and/or distance 39). Layer 14 typically is doped higher than conventional power devices for a given BVdss rating so that device 10 achieves improved on resistance performance. It is understood that other materials may be used for semiconductor material 11 or portions thereof such as layer 14 including silicon-germanium, silicon-germanium-carbon, carbon doped silicon, III-V materials, combinations thereof, or the like.

Active devices 103 include trenches, active trenches, filled trenches, or grooves 21, that extend from a major surface 18 into region of semiconductor material 14. In one embodiment, trenches 21 extend through region of semiconductor material 14 and terminate within or in proximity to substrate 12. By way of example, trenches 21 are formed using Deep Reactive Ion Etching (DRIE) etching with a fluorine or chlorine based chemistry. Several techniques are available for DRIE etching including cryogenic, high density plasma, or Bosch DRIE processing.

Trenches 21 further include a trench fill material 22 formed within them. By way of example, trench fill material 22 includes a single crystalline/crystal semiconductor material such as undoped or lightly doped single crystal silicon, a polycrystalline semiconductor material such as undoped or lightly doped polysilicon, a dielectric material such as an oxide, semi-insulating polysilicon (e.g., SIPOS), combinations thereof, or the like. Trench fill material 22 is formed using conventional deposition and planarization techniques.

Active devices 103 further include body or base region or regions 24, which in the embodiment shown comprise p-type conductivity, and form a pn junction with region of semiconductor material 14. By way of example, base regions 24 have a dopant concentration suitable for forming an inversion layer that operates as conduction channels for device 10 when device 10 is in operation. Base regions 24 extend from major surface 18 to a depth of about 1.0 to about 5.0 microns. N-type source regions 26 are formed within or in base regions 24 and extend from major surface 18 to a depth, for example, of about 0.2 microns to about 0.5 microns. P-type base contacts or contact regions 27 are also formed in base regions 24, and provide a lower contact resistance to base regions 24 at major surface 18. It is understood that base regions 24 comprise a plurality of discrete base regions or a single base region coupled together.

Figure 3:
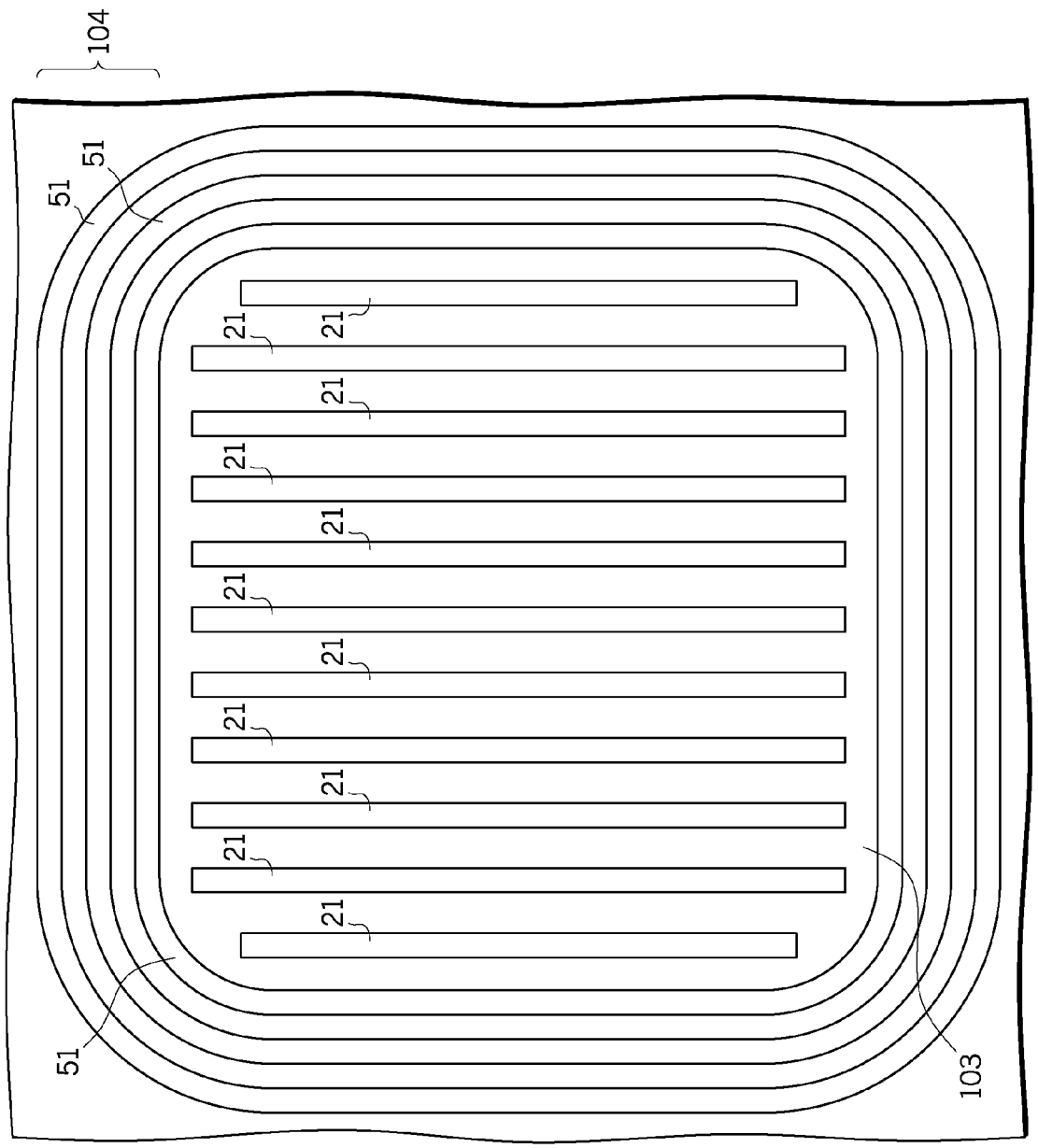
FIG. 3 illustrates a top view of a superjunction device.

Active devices 103 also include doped or compensating regions 23, which are formed along at least portions of the sidewall surfaces of trenches 21. Doped regions 23 are formed, for example, before trenches 21 are filled using conventional angled ion implantation techniques, doped liner or film techniques, or gas phase diffusion techniques. In this embodiment, doped regions 23 comprise p-type conductivity, and are configured to compensate region of semiconductor material 14 between adjacent trenches 21 to form a superjunction structure. Specifically, doped regions 23 are configured to have a charge density that is substantially equal to the charge density of region of semiconductor material 14 between adjacent trenches 21 so that these regions deplete or compensate each other under reverse bias conditions. By way of example, doped regions 23 have a peak dopant concentration on the order of about $3.0\times10^{16}$ atoms/cm$^3$, and a depth or width of about one (1) micrometer when distance 39 is about seven (7) micrometers and region of semiconductor material 14 has a dopant concentration of about $5.0\times10^{15}$ atoms/cm$^3$. In one embodiment when trenches 21 comprise long stripe like trenches as shown in FIG. 3, doped regions 23 are formed in one embodiment along all sidewall portions including lengthwise side portions and end portions of trenches 21.

Active devices 103 further include insulated control electrodes 31 formed adjacent to or in proximity to base regions 24 and source regions 26. Control electrodes 31 comprise gate dielectric layer or layers 43. In one embodiment, gate dielectric layers 43 comprise silicon oxide, and have a thickness of about 0.05 microns to about 0.1 microns. In alternative embodiments, dielectric layers 43 comprise silicon nitride, tantalum pentoxide, titanium dioxide, barium strontium titanate, or combinations thereof including combinations with silicon oxide, or the like.

Control electrodes 31 further include conductive electrodes 44 formed adjoining or overlying gate dielectric layers 43, and comprise, for example, doped polysilicon, silicided polysilicon, a metal, or the like. Control electrodes 31 are formed using conventional techniques. It is understood that although control electrodes 31 are shown as planar structures, those skilled in the art will appreciate that the present invention is suitable for trench gated control electrode structures in active region 101 as well. A passivating layer or interlayer dielectric layer or region 47 is formed overlying or adjacent trenches 21 and control electrodes 31. By way of example, passivating layer 47 comprises an oxide or other dielectric material(s) formed and patterned using conventional techniques to provide desired openings.

Termination structure 104 comprises a plurality of trenches or grooves 51. By way of example, trenches 51 are formed within a peripheral or portion of the device 10, and extend, in one embodiment, from major surface 18 through region of semiconductor material 14 and terminate in proximity to or within substrate 12. In one embodiment, trenches 51 all have the same depth. For ease of manufacture, trenches 51 are conveniently formed at the same time as trenches 21 using the same etching techniques. Additionally, trenches 51 and trenches 21 are formed with the same or similar widths. Alternatively, trenches 51 have widths that are different than the widths of trenches 21. In a further embodiment, trenches 51 have widths that vary among themselves. In one embodiment, trenches 51 have widths 54 between about two (2) micrometers and about six (6) micrometers. In one embodiment suitable for 650 volts, termination structure 104 comprises between about ten (10) and about fifteen (15) termination trenches 51.

An innermost termination trench 511 is spaced a distance 56 from a second innermost termination trench 512, and second innermost termination 512 is spaced a distance 57 from a third innermost termination trench 513. In one embodiment, distance 56 is between about five (5) micrometers to about nine (9) micrometers, and distance 57 is about seven (7) micrometers.

Termination structure 104 also includes doped or compensating regions 63, which are formed along at least portions of the sidewall surfaces of trenches 51. In one embodiment, each doped region 63 extends along the entire length or height of sidewalls of each of termination trenches 51. Doped regions 63 are formed, for example, before trenches 51 are filled using conventional angled ion implantation techniques, doped liner or film techniques, or gas phase diffusion techniques. Doped regions 63 are conveniently formed at the same time as or simultaneously with doped regions 23. Because of the trench structure of structure 104, each of doped regions 23 and 63 are doped similarly or have the same or a substantially equivalent charge densities, which saves on manufacturing costs and reduces process complexity. Doped regions 63 comprise p-type conductivity, and like doped regions 23, are configured to compensate region of semiconductor material 14 between adjacent trenches 51 to form a superjunction structure. That is, doped regions 63 are configured to have a charge density that is substantially equal to or substantially balances the charge density of region of semiconductor material 14 between adjacent trenches 51 so that these regions compensate each other under reverse bias conditions. By way of example, doped regions 63 have a peak dopant concentration on the order of about $3.0\times10^{16}$ atoms/cm$^3$ and a depth or width of about one (1) micrometer when the distance between adjacent termination trenches 51 is about seven (7) micrometers, and region of semiconductor material has a dopant concentration of about $5.0\times10^{15}$ atoms/cm$^3$.

Termination structure 104 further includes a trench fill material(s) 72 formed within termination trenches 51. Trench fill material 72 comprises a semiconductor material such as a single crystalline/crystal semiconductor material(s) (e.g., undoped or lightly doped single crystal silicon) or a polycrystalline semiconductor material(s) (e.g., undoped or lightly doped polysilicon). When trench fill material 72 comprises lightly doped semiconductor material, the dopant concentration is about two to about three orders of magnitude less than the dopant concentration of region of semiconductor material 14, and trench fill material 72 typically is the same conductivity type as region of semiconductor material 14 for that embodiment. Trench fill material 72 is formed using conventional deposition and planarization techniques.

Trench fill material 72 is configured to support depletion spreading when device 10 is under reverse bias conditions. That is, trench fill material 72 is configured to allow the depletion region to spread through termination trenches 51. More particularly, trench fill material 72 does not comprise a dielectric material or like material that would impede the depletion spread through trenches 51 thereby resulting in a reduced and undesirable BVdss.

Passivating layer 47 is formed to overlie all or portion of termination trenches 51. In one embodiment, all of doped regions 63, trenches 51, and trench fill material 72 are electrically within trenches 51 floating. A current carrying or source electrode 91 is electrically coupled to active devices 103 including source regions 26, contact regions 27, base regions 24, and doped regions 23. Another current carrying electrode, first, or drain electrode 109 is formed, for example, on or overlying a surface of substrate 12 as shown in FIG. 1. Electrodes 91 and 109 are formed using conventional techniques.

Electrode 91 extends to overlie insulating layer 47 in termination region 102 to form a field plate 910. In one embodiment, field plate 910 covers only portion of termination trenches 51, such as termination trenches 511 and 512, or termination trenches 511, 512, and 513.

The operation of device 10 proceeds as follows. Assume that electrode 91 is operating at a potential $V_S$ of zero volts, control electrodes 31 receive a control voltage $V_G$=2.5 volts, which is greater than the conduction threshold of device 10, and electrode 109 operates at a drain potential $V_D$=5.0 volts. The values of $V_G$ and $V_S$ cause base regions 24 to invert under control electrodes 31 to form channel regions, which electrically connect source regions 26 to region of semiconductor material 14. A device current $I_S$ flows from electrode 91 and is routed through source regions 26, the channel regions, region of semiconductor material 14 to electrode 109. Hence, current $I_S$ flows vertically through region of semiconductor material 14, which is more heavily doped than conventional power devices, to produce a low on resistance. In one embodiment, $I_S$=1.0 amperes.

To switch device 10 to the off state, a control voltage $V_G$ of less than the conduction threshold of device 10 is applied to control electrodes 31 (e.g., $V_G$<2.5 volts). This removes the channel regions and $I_S$ no longer flows through device 10. In the off state, regions 23 and 63 and region of semiconductor material 14 compensate each other as the depletion region from the primary blocking junction (i.e., junction formed between base regions 24 and region of semiconductor material 14) spreads, which enhances BVdss. Termination trenches 51 function to effectively reduce electric field build up as the depletion region from the primary blocking junction spreads further, which further enhances BVdss.

By way of example, simulation results show that a device 10 having termination trenches 51 with widths of about three (3) micrometers to about five (5) micrometers, distance 56 on the order of about five (5) micrometers to about nine (9) micrometers, and a distance 57 on the order of about seven (7) micrometers, sustained BVdss values greater than 600 volts.

In this embodiment, innermost termination trench 511 has a width between about two (2) micrometers and about six (6) micrometers.

Figure 2:
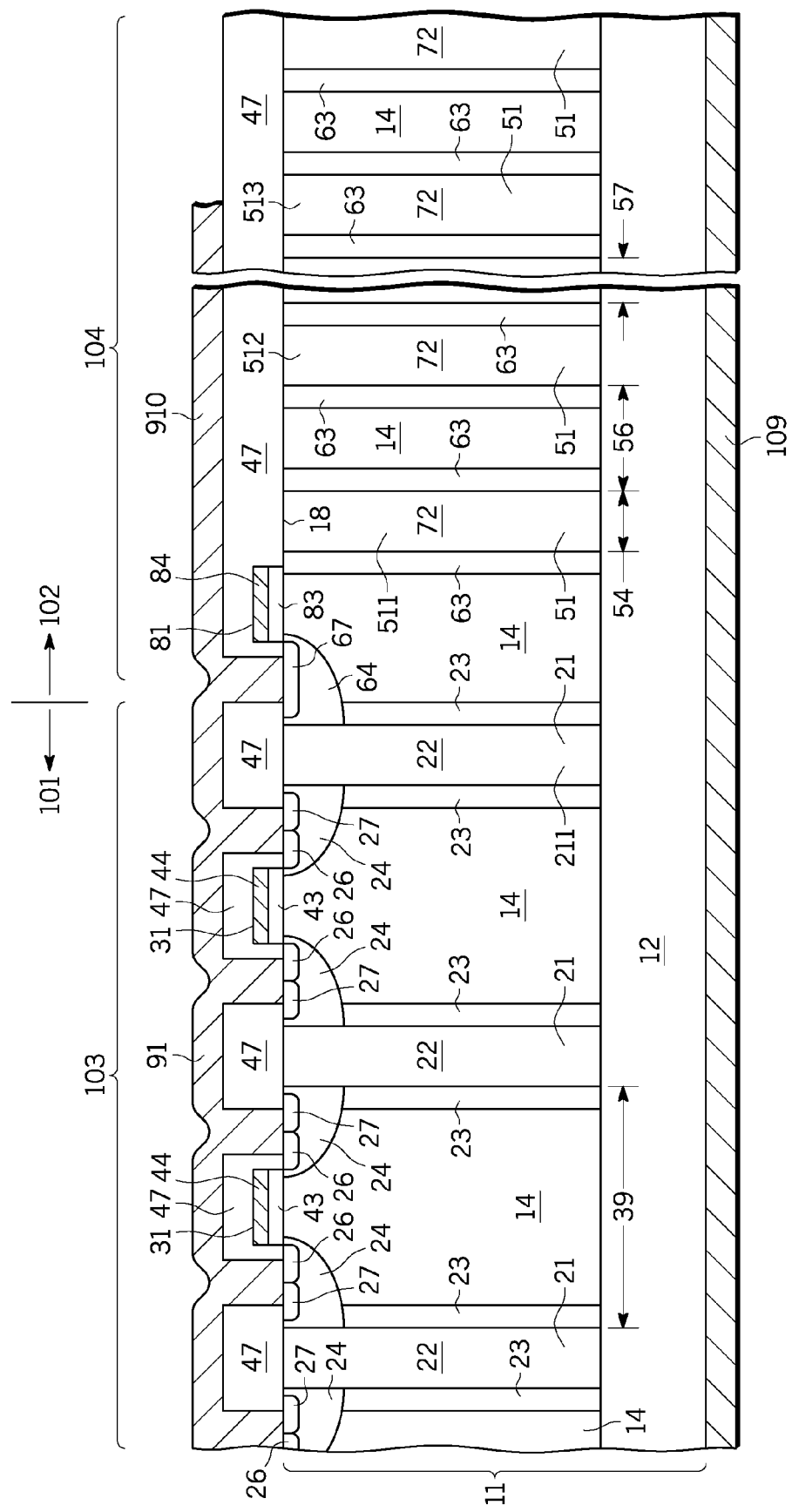
FIG. 2 illustrates an enlarged partial cross-sectional view of an alternative embodiment of a superjunction device.

FIG. 2 shows a partial cross-sectional view of another embodiment of a superjunction device 20. Device 20 is similar to device 10 except that device 20 further includes a termination junction 64, which is formed adjacent outermost active trench 211 and between outermost active trench 211 and innermost termination trench 511. Termination junction 64 comprises p-type conductivity, and is conveniently formed at the same time as base regions 24. One advantage of termination junction 64 is that less termination trenches 51 (e.g., less than about ten) are used in this embodiment. In this alternative embodiment, a contact region 67 is formed with termination junction 64 to, for example, lower contact resistance to termination junction 64. Contact region 67 is conveniently formed at the same time as contact regions 27.

In a further embodiment, a second insulated control electrode 81 is formed adjacent to or in proximity to termination junction 64 to further enhance the termination characteristics. In one embodiment, control electrodes 81 and 31 are electrically coupled to together. Control electrode 81 includes a gate dielectric layer 83. In one embodiment, gate dielectric layer 83 comprises silicon oxide, and has a thickness of about 0.05 microns to about 0.1 microns. In alternative embodiments, dielectric layer 83 comprises silicon nitride, tantalum pentoxide, titanium dioxide, barium strontium titanate, or combinations thereof including combinations with silicon oxide, or the like.

Control electrode 81 further includes a conductive electrode 84 formed overlying gate dielectric layer 83, and comprises, for example, doped polysilicon, silicided polysilicon, a metal, or the like. Control electrode 81 is formed using conventional techniques, and is conveniently formed at the same time as control electrodes 31. It is understood that although control electrodes 31 are suitable for planar or trench gate configurations, it is preferred that control electrode 81 is a planar structure. Passivating layer 47 is formed overlying second control electrode 81.

In the embodiment where termination junction 64 is included, electrode 91 is further electrically coupled to termination junction 64 and contact region 67, and one of doped regions 23 in proximity to termination junction 64, while trench fill material 72 within termination trenches 51 and doped regions 63 are electrically floating similar to device 10.

FIG. 3 shows a top view of an embodiment of device 10 or 20. As shown in FIG. 3, trenches 21 comprise a plurality of stripes or striped shaped trenches in active region 103, and trenches 51 comprise a plurality of concentric rings formed in termination region 104 that laterally surrounding trenches 21. In one embodiment, each of trenches 51 are continuous and do not terminate, and doped regions 63 are formed along all sidewall portions of trenches 51.

In summary, a superjunction structure having filled trenches in both the active region and the termination region. The termination region includes termination trenches having a trench fill material that is configured to support depletion region spread in the termination region, which reduces electric field build-up and enhances BVdss. Also, the termination region includes a superjunction structure that further enhances BVdss performance. Among other things, the termination structure overcomes design challenges present in prior art superjunction devices. Additionally, the termination structure is conveniently formed with active device superjunction structures to simplify process integration.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

I claim:

1. A superjunction semiconductor device comprising:
a semiconductor substrate having a surface configured to form a first electrode;
a region of semiconductor material formed in spaced relationship with the semiconductor substrate and having an active region and a termination region, the region of semiconductor material having a first conductivity type and a first charge density;
an active device formed in the active region, wherein the active device comprises:
first and second trenches formed in the region of semiconductor material, wherein the first and second trenches have sidewall surfaces;
first doped regions of a second conductivity type opposite the first conductivity type formed along at least portions of the sidewall surfaces of the first and second trenches, wherein the first doped regions have a second charge density configured to balance the first charge density to form a superjunction structure;
a base region of the second conductivity type formed in the region of semiconductor material between the first and second trenches;
a source region of the first conductivity type formed in the base region;
a first insulated control electrode adjacent the base region and the source region and configured to control current flow between the source region and the first electrode; and
a first trench fill material formed within the first and second trenches; and
a termination structure formed in the termination region, wherein the termination structure comprises:
a plurality of termination trenches formed in the body of semiconductor material and extending to the semiconductor substrate, wherein each of the plurality of termination trenches has second doped regions of the second conductivity type formed along sidewall surfaces, wherein the second doped regions have the second charge density configured to balance the first charge density;
a second trench fill material formed within the plurality of termination trenches, wherein the second trench fill material comprises a material that is configured to allow a depletion region to spread through at least a portion of the plurality of termination trenches; and
an insulating layer formed overlying the termination structure and configured so that the second trench fill material within the plurality of termination trenches and the second doped regions are floating.

2. The device of claim 1, wherein the first and second trench fill materials comprises the same material.

3. The device of claim 1, wherein the first and second trench fill materials comprise different materials.

4. The device of claim 3, wherein the first trench fill material comprises a dielectric material, and wherein the second the trench fill material comprises a semiconductor material.

5. The device of claim 4, wherein the second trench fill material comprises a polycrystalline semiconductor material.

6. The device of claim 4, wherein the second trench fill material comprises a single crystal semiconductor material.

7. The device of claim 1, wherein each of the first doped regions and each of the second doped regions have substantially equivalent charge densities.

8. The device of claim 1, further comprising a field plate overlying the insulating layer and only a portion of the plurality of termination trenches.

9. The device of claim 1, wherein the second doped regions extend along an entire length of the sidewalls of the plurality of termination trenches.

10. The device of claim 1, wherein the first and second trenches comprise striped shaped trenches, and wherein the plurality of termination trenches comprise concentric rings laterally surrounding the first and second trenches.

11. The device of claim 1 further comprising a terminating junction of the second conductivity type formed in the body of semiconductor material between the second trench and an innermost termination trench, and wherein outermost termination trenches are formed devoid of any terminating junctions between them.

12. The device of claim 11 further comprising a second insulated control electrode adjacent the termination junction, and wherein the termination junction is electrically coupled to the source region.

13. The device of claim 1, wherein an outer edge of an innermost termination trench is spaced apart from an inner edge of a second innermost termination trench a distance between about five micrometers and about nine micrometers, and wherein the innermost termination trench has a width between about two micrometers and five micrometers.

14. A superjunction semiconductor device comprising:
a semiconductor substrate having a surface configured to form a first electrode;
a region of semiconductor material formed in spaced relationship with the semiconductor substrate and having an active region and a termination region, the region of semiconductor material having a first conductivity type and a first charge density;
an active device formed in the active region, wherein the active device comprises:
first and second trenches formed in the region of semiconductor material, wherein the first and second trenches have sidewall surfaces;
first doped regions of a second conductivity type opposite the first conductivity type formed along at least portions of the sidewall surfaces of the first and second trenches, wherein the first doped regions have a second charge density configured to balance the first charge density to form a superjunction structure;
a base region of the second conductivity type formed in the region of semiconductor material between the first and second trenches;
a source region of the first conductivity type formed in the base region;
a first insulated control electrode adjacent the base region and the source region and configured to control current flow between the source region and the first electrode; and
a first trench fill material formed within the first and second trenches, wherein the first trench fill material comprises a dielectric material; and
a termination structure formed in the termination region, wherein the termination structure comprises:
a plurality of termination trenches formed in the body of semiconductor material and extending to the semiconductor substrate, wherein each of the plurality of termination trenches has second doped regions of the second conductivity type formed along sidewall surfaces, wherein the second doped regions have the second charge density configured to balance the first charge density;

a second trench fill material formed within the plurality of termination trenches, wherein the second trench fill material comprises a semiconductor material, and wherein the second trench fill material is formed absent a material that would impede depletion region spread through at least a portion of the plurality of termination trenches when the superjunction semiconductor is in operation; and an insulating layer formed overlying the termination structure and configured so that the second trench fill material within plurality of termination trenches and the second doped regions are floating.

15. The device of claim 14 further comprising a terminating junction of the second conductivity type formed in the body of semiconductor material between the second trench and an innermost termination trench.

16. The device of claim 15 further comprising a second insulated control electrode adjacent the termination junction, and wherein the termination junction is electrically coupled to the source region.

17. The device of claim 14, wherein the second trench fill material comprises a lightly doped semiconductor material having a dopant concentration between about two to about three orders of magnitude less than that of the region of semiconductor material.

18. A superjunction semiconductor device comprising:
a semiconductor substrate having a surface configured to form a first electrode;
a region of semiconductor material formed in spaced relationship with the semiconductor substrate and having an active region and a termination region, the region of semiconductor material having a first conductivity type and a first charge density;
an active device formed in the active region, wherein the active device comprises:
first and second trenches formed in the region of semiconductor material, wherein the first and second trenches have sidewall surfaces;
first doped regions of a second conductivity type opposite the first conductivity type formed along at least portions of the sidewall surfaces of the first and second trenches, wherein the first doped regions have a second charge density configured to balance the first charge density to form a superjunction structure;
a base region of the second conductivity type formed in the region of semiconductor material between the first and second trenches;
a source region of the first conductivity type formed in the base region;
a first insulated control electrode adjacent the base region and the source region and configured to control current flow between the source region and the first electrode; and
a first trench fill material formed within the first and second trenches; and
a termination structure formed in the termination region, wherein the termination structure comprises:
a plurality of termination trenches formed in the body of semiconductor material and extending to the semiconductor substrate, wherein each of the plurality of termination trenches is continuous and each has second doped regions of the second conductivity type formed along sidewall surfaces, wherein the second doped regions have the second charge density configured to balance the first charge density;
a second trench fill material formed within the plurality of termination trenches, wherein the second trench fill material comprises single crystal semiconductor material that is devoid of dielectric material; and
an insulating layer formed overlying the termination structure and configured so that the second trench fill material within plurality of termination trenches and the second doped regions are floating.

19. The device of claim 18 further comprising:
a terminating junction of the second conductivity type formed in the body of semiconductor material between the second trench and an innermost termination trench; and
a second insulated control electrode adjacent the termination junction, and wherein the termination junction is electrically coupled to the source region.

20. The device of claim 18, wherein the semiconductor substrate comprises the first conductivity type.

* * * * *